United States Patent [19]

Grünwald et al.

[11] Patent Number: 4,522,671
[45] Date of Patent: Jun. 11, 1985

[54] METHOD OF APPLYING AN ELECTRICAL CONDUCTOR PATTERN ON AN APERTURED SUBSTRATE

[75] Inventors: Werner Grünwald, Gerlingen; Heinz Pfizenmaier, Leonberg; Claudio de la Prieta, Stuttgart; Kurt Schmid, Ditzingen; Ewald Schmidt, Ludwigsburg, all of Fed. Rep. of Germany

[73] Assignee: Robert Bosch GmbH, Stuttgart, Fed. Rep. of Germany

[21] Appl. No.: 441,033

[22] Filed: Nov. 12, 1982

[30] Foreign Application Priority Data

Nov. 17, 1981 [DE] Fed. Rep. of Germany ....... 3145585

[51] Int. Cl.³ .................. B44C 1/14; B32B 31/00; B29C 19/00; H01F 7/06
[52] U.S. Cl. ..................... 156/235; 156/240; 156/289; 156/293; 156/277; 29/602 R; 336/200
[58] Field of Search ............. 156/215, 214, 230, 235, 156/240, 277, 249, 293, 493, 488, 233, 85, 90, 102, 144, 289, 304.2; 29/602 R, 605, 606, DIG. 1; 427/104; 336/200, 208; 101/34

[56] References Cited

U.S. PATENT DOCUMENTS

| | | | |
|---|---|---|---|
| 3,701,317 | 10/1972 | Miyamoto et al. | 101/170 |
| 3,833,872 | 9/1974 | Marcus et al. | 336/200 |
| 3,858,138 | 12/1974 | Gittleman et al. | 336/200 |
| 3,887,420 | 6/1975 | Weingrad | 156/240 |
| 3,932,251 | 1/1976 | Tanaka | 156/293 |
| 4,117,588 | 10/1978 | Johnson | 29/602 R |
| 4,264,647 | 4/1981 | Trevorrow | 264/269 |
| 4,347,113 | 8/1982 | Fischer et al. | 427/126.2 |
| 4,392,905 | 7/1983 | Boyd et al. | 156/493 |

FOREIGN PATENT DOCUMENTS

| | | | |
|---|---|---|---|
| 140104 | 8/1983 | Japan | 336/200 |
| 2045540 | 10/1980 | United Kingdom . | |

Primary Examiner—Edward Kimlin
Assistant Examiner—Louis Falasco
Attorney, Agent, or Firm—Frishauf, Holtz, Goodman & Woodward

[57] ABSTRACT

To make inductance elements, thick film electrically conductive paste, which may include precious metal such as silver, are applied by a deformable stamp on a ferrite core which, for example, can be someone hump shaped, for adhesion to a carrier (30) and formed with openings thereto, the stamp being shaped to fit within the opening and deforming to penetrate the opening to apply the thick film conductive paste in form of conductive tracks thereon. Conductive tracks can be applied, previously, to a substrate carrier (30), which are then joined by the paste strips to form interconnected windings (FIGS. 1a, 1b); or the ferrite may be in form of a toroidal core (34), on which the conductive tracks are applied around all surfaces, to form connected windings thereon, the deformable stamp having a projecting tip which can fit within the opening of the toroidal core.

7 Claims, 7 Drawing Figures

METHOD OF APPLYING AN ELECTRICAL CONDUCTOR PATTERN ON AN APERTURED SUBSTRATE

Reference to related patent and applications, the disclosure of which is hereby incorporated by reference, assigned to the assignee of the present invention:

U.S. Pat. No. 4,347,113, Aug. 31, 1982, Fischer et al

U.S. application Ser. No. 427,601, filed Sept. 29, 1982 Grunwald et al. entitled "PRINTING PASTE AND METHOD OF APPLYING SAID PASTE", Reference to related patents:

German Patent Disclosure Document DE-OS No. 30 02 112, Wertz et al, DE-OS No. 31 45 586, Brill, both assigned to the assignee of this application;

U.S. Pat. No. 4,264,647, Trevorrow, based on Ser. No. 30,776, Apr. 17, 1979 and No. 80,449, Oct. 1, 1979 (Corresponding: German DE-OS No. 30 14 877)

U.S. Pat. No. 3,701,317, Miyamoto (Corresponding: German Pat. No. 1,771,551)

The present invention relates to a method to apply an electrically conductive pattern on a substrate which has an aperture, so that the pattern extends into and through the aperture, and more particularly to such a method suitable to make an inductance in which the electrically conductive pattern represents a coil winding, and the substrate, for example, is a ferrite core element.

It has previously been proposed to apply electrically conductive patterns, printed circuits, and the like by rolling-on, stamping, or painting electrically conductive paste on a substrate. Various applications methods have been used, for example screen printing. It has also been proposed to apply electrically conductive coating on the inside of a cylindrical element, for example in order to make the interior electrode of an exhaust gas oxygen sensor by introducing an electrically conductive liquid or paste in a measured quantity within the cylindrical body, and applying the paste or liquid against the surface of the cylindrical body by also introducing a balloon-like element therein, and blowing up the balloon. Such a system is described in U.S. Pat. No. 4,264,647, Trevorrow.

The types of electrical paste, and the uses thereof are described in the referenced U.S. Pat. No. 4,347,113, Fischer et al, and in German Patent Disclosure Document DE-OS No. 30 02 112, Wertz et al.

Various methods discribed in the published prior art are difficult to carry out if the substrates are not plane or flat, and particularly if the substrates have an uneven surface. These methods are only selectively applicable if the conductors to be applied include inherently expensive materials, such as a paste which includes noble metals such as silver, gold or platinum, since the quantity of the material being applied on the substrate is difficult to control.

THE INVENTION

It is an object of the present invention to provide a method of applying electrical conductors in a desired pattern on a surface which is non-planar, and particularly which includes an aperture therein, especially a substrate formed as a ferrite core, in which the conductor pattern forms the winding on the core in order to construct an inductance element, without requiring the step of winding a wire through an aperture in the core.

Briefly, an elastically deforming printing stamp, for example made of silicone rubber has a pattern applied thereon corresponding to the pattern of electrical conductors to be applied on the substrate. The printing stamp is pressed against the substrate with sufficient pressure to deform the printing stamp so that it can penetrate within an opening of a ferrite core, or at least within part thereof, so that the conductive paste is transferred to the substrate core, and also within the aperture or opening thereof. If the aperture is too deep to permit penetration of the stamp therethrough in one step, the stamp can be made for example with a projecting tip-like portion which fits to within half the depth of the opening, and the printing step then repeated from the other side, so that the conductive tracks applied by the deformable printing stamp will join at the inside of the opening to form a single continuous conductive track.

Preferably, the pattern of application on the printing stamp is so arranged that it is pre-distorted, allowing for distortion of the pattern on the stamp as the stamp is deformed during the application pressure, so that the eventual pattern which is printed will be as desired.

The method in accordance with invention has the advantage that inductances can be readily made with substantial decrease in manufacturing time and complexity. In accordance with most procedures, inductances were either wound with wires in which wires were introduced through openings of a ferrite core, for example of general cylindrical, disc shaped; or pre-wound wire coils where applied to inductance elements. If the elements are ring shaped, for example to make toroidal cores, difficulty was experienced in applying the inductance conductive tracks.

Inductances made in accordance with the present invention also have the advantage that they can be constructed with less space requirement than previously known structures, and thus are particularly suitable for association with hybrid circuits, in which discrete electronic network components or elements are used in association with printed circuits. The paste which is applied by the deformable printing step can be accurately measured, so that, even if the conductive paste contains materials which are inherently expensive—for example silver—the cost of manufacture of such inductances can be substantially reduced. The stray or leakage inductance fields made in accordance with features of the present invention are low, and parasitic capacities can be readily avoided.

Exact measurements of the quantity of material used, and precise maintenance of predetermined geometries can be obtained by transferring the printing pattern of the paste from a transfer element; the transfer element may be similar to a plate cylinder in a printing system, in that it carries the pattern of the paste to be transferred, and, upon engagement with the printing stamp, so transfers the exact quantity of paste material to the surface of the printing stamp. Thus, the geometry and layout of the paste being transferred can be accurately controlled, as well as the quantity of material.

Relative movement between the printing stamp and the substrate can be as desired—for example rotary, or translatory. For specific applications, rotary movement or sequentially occurring translatory movement with intervening indexing of either the substrate or the stamp may be suitable. Indexing and translatory movement also provides for exact positioning of the conductive tracks or patterns on the substrate, which is particularly important if these tracks or substrates are to meet other tracks which have already been applied, or which are to be applied in a subsequent printing step, or in which closed loops are to be formed in which a track portion is to be extended by another track portion.

DRAWINGS

Figure 2A:
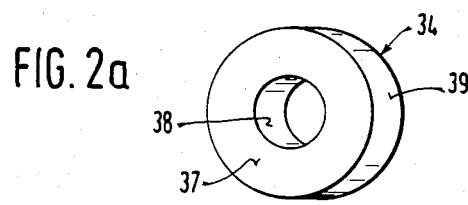
Figure 2B:
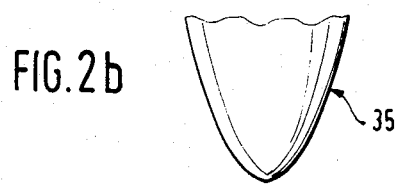
Figure 2C:
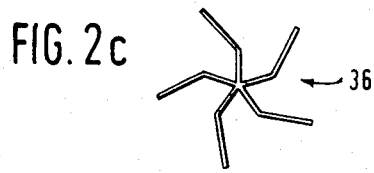
Figure 2D:
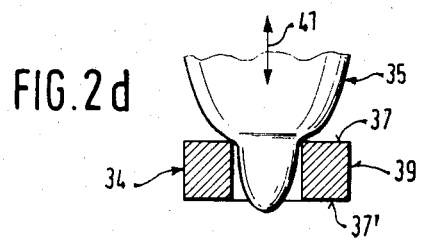
Figure 2E:
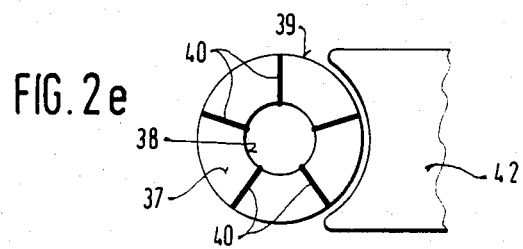

FIG. 2, collectively, illustrates sequential steps in the manufacture of a toroidal inductance, in which FIG. 2a is a pictorial view of the toroid core;

FIG. 2b of the printing stamp;

FIG. 2c is a developed end view of a conductive pattern;

FIG. 2d is a part sectional part side view of one portion of the printing step; and FIG. 2e is a schematic view of printing a conductor on the outer circumference on the core of FIG. 2a.

DETAILED DESCRIPTION

Figure 1A:
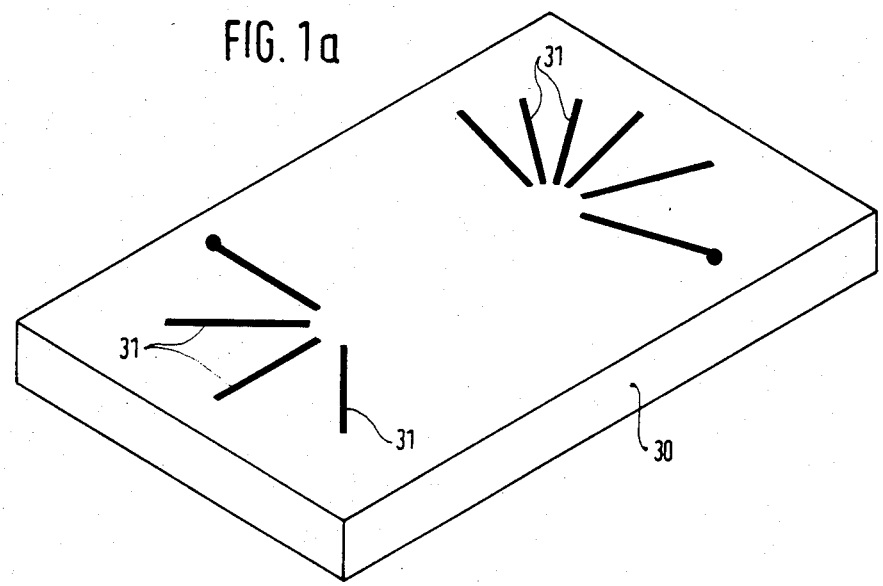
FIG. 1a is a pictorial representation of a carrier for a ferrite core to form an inductance, and illustrating a first manufacturing step in the manufacture of the inductance.

The invention will be explained in connection with the manufacture of an inductance. In accordance with the embodiment of FIG. 1, an insulating flat carrier 30 has conductive tracks 31 printed thereon. The printing method of the conductive tracks can be in accordance with any known system, for example screen printing; in accordance with the present invention, the tracks 31 are made by applying an elastically deformable printing stamp, preferably made of silicone rubber, with a conductive paste positioned thereon in accordance with the tracks 31, on the carrier 30. The printing stamp, if cylindrical, can have the pattern of the arrangement of the tracks 31 applied on the circumference, and the cylindrical stamp then rolled on the flat carrier 30. Alternatively, the printing stamp can be formed with a flat end face, on which the conductive paste is applied in the form of the tracks 31, and reciprocated against the carrier 30. The paste is applied to the stamp by etching the image of the applied tracks into a printing plate, and transferring paste from the etched plate to the silicone stamp.

The tracks 31, preferably are made of conductive paste of known composition, or for example as explained in the referenced application Ser. No. 06/427,601 filed 9-29-82, Grunwald et al, "Printing Paste and Method of Applying Said Paste".

Figure 1B:
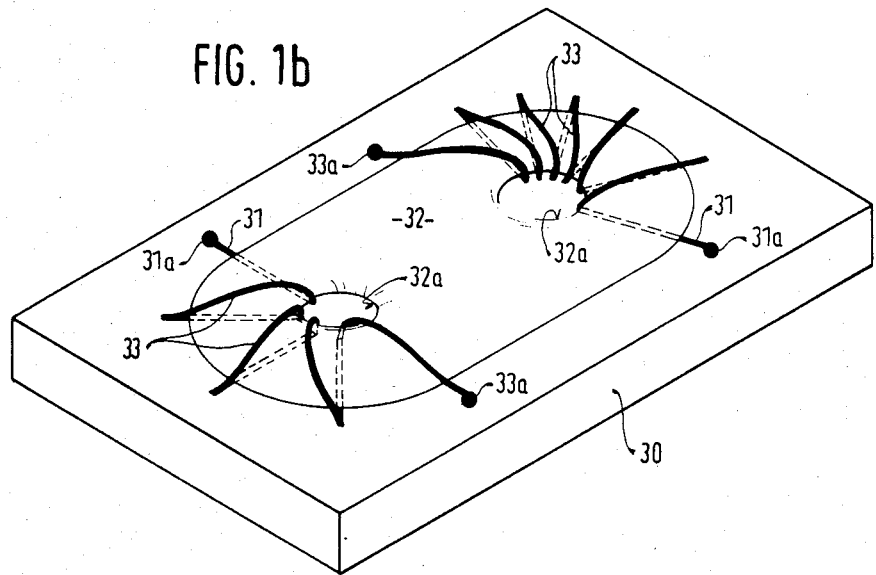
FIG. 1b illustrates the carrier of FIG. 1a with a ferrite core applied thereto.

The tracks 31 will form one side of the windings of the inductance. After they have been applied—see FIG. 1a—a ferrite core 32 is placed on the carrier 30, above the printed tracks. Thereafter, and in a second step, the winding tracks 33 are printed over the ferrite core, and so arranged that the ends of the tracks 33 connect the respective ends of the tracks 31 to form closed windings, as seen in FIG. 1b. Thus, the upper conductive tracks 33 pass through the openings 32a of the core 32. The upper windings 33, then, complete the conductive loops passing around the opening 32a of the core, and provide a multiple turn connected conductor surrounding the ferrite core 32 and extending about the structure thereof between the outside and opening 32a. The ferrite core 32 is preferably connected to the substrate 30 by adhesion, and thus permanently located thereon. The result will be an inductance in chip form, which is space saving and excellently suitable for integration with hybrid circuits. Of course, the carrier 30 may, itself form a substrate of a hybrid circuit; it is illustrated in separate chip form only for purposes of illustration, and further circuits can be connected to the terminal points 31a, 33a of the conductors, or conductive tracks on the carrier 30 and on the ferrite core 32, respectively.

FIG. 2, collectively, illustrates a method and structure to make small inductances in toroidal shape. A ferrite core 34—see FIG. 2a—has a central opening 38, an outer surface 39, and end face surfaces 37. A printing stamp 35 —see FIG. 2b —made of silicone rubber is shaped to have an projecting tip, the end portion of which is shown in FIG. 2b. A pattern 36—see FIG. 2c—is applied to the end portion of the deformable stamp 35. The pattern 36, with which the conductive paste is applied corresponds to a stencil pattern, or an application pattern which is transferred by the stamp 35 to the core 34. The shape of the pattern 36 is such that, upon deformation of the stamp 35, a pattern as illustrated in FIG. 2e, to be described, will result.

After a pattern 36 of electrically conductive paste is applied on the stamp 35, the stamp 35 is introduced into the bore or opening 38 of the ferrite core. Upon such introduction, the stamp 35 will deform—see FIG. 2d—and transfer the paste both on the end surface 37 as well as on the interior surfaces of the bore 38. The stamp 35 is introduced in accordance with the arrow 41. It is not necessary that the paste be applied to the opening or bore 38 in one step; rather, not less than half of the depth of the bore 38 has interior tracks applied thereto. In a further operating step, the core and stamp are respectively reversed, so that the mirror image of the tracks as seen in FIG. 2c are transferred to the other facing surface 37'. A portion of the facing conductive tracks 40 likewise can be applied upon introduction of the stamp 35 into the bore 38, to form at least stub conductors on the end faces 37, 37'. In a further manufacturing step, the conductive tracks 40 are printed on the end faces 37, 37' and, in a final step, conductive tracks at the outer circumference are applied by a deformable stamp 42, translated with respect to the circumference 39 of the core 34. This printing step by the translating printing stamp 42 is repeated three times, with relative indexing of the stamp 42 and the core 34, and translatory printing movement of the deformable stamp 42 perpendicular to the outer circumference 35 to the core 34. The conductive tracks 40 need not extend in radial direction, as shown, but may be skewed.

The metallic component of the conductive paste used in the conductive tracts 40 on the ferrite core of FIG. 2 preferably is silver.

Rather than using a translatory stamp 42, the conductive tracks 40 at the circumference 39 can be applied by relative rolling movement of the core 38 and a cylindrical, or roller-type application stamp.

The arrangements to make inductances, and particularly inductances with ferrite cores have substantial advantages in manufacture with respect to known manufacturing processes, and particulary with respect to methods in which wires are wound around and through an opening in a core. Threading individual wire windings through a core, or manufacturing preformed windings and placing the cores therein is comparatively complex and time consuming. The particular advantage of the arrangement is that the inductance will be accurately reproducable with high precision. Wire wound ferrite cores may change the inductance if the loops of the wire wrapped thereabout slip on the core. The print-on conductive paths maintain their orientation, thus maintaining the inductance at a defined value.

The embodiment of FIG. 1 results in a quite flat inductance which is eminently suitable for use in hybrid circuits in which integrated circuit arrangements are combined with inductances. As can readily be seen, the positioning of the conductor tracks can be so arranged that parasitic capacities between the respective conductive tracks are minimized. The conductive tracks themselves are located in accordance with the application pattern and do not require mutual engagement for mechanical support. The pastes used are then sintered, or otherwise set in position, for example by curing. The method permits manufacture of precisely shaped and dimensioned thick film patterns, in which the conductive tracks can extend through openings.

The printing stamp used, preferably silicone rubber, permits application of conductive pastes on non-planar surfaces, and particularly on surfaces formed with an opening, without distortion of the printing pattern from that of a desired pattern. Any distortion which may occur due to deformation of the printing step can be compensated by pre-distorting the pattern being applied to the stamp before it is deformed so that, upon deformation of the stamp, the desired pattern will result.

A particularly suitable printing paste uses as an organic carrier, for example, about 6% ethyl cellulose, 79% alpha terpineol and 15% benzyl alcohol (all percentages by weight). These compounds are intimately mixed to obtain a carrier, to which a conductive powder including a metal, for example silver, platinum or other metal and a pulverized ceramic are added, to form a conductive paste, the conductivity, or resistance of which can be controlled by suitable control of the quantity and type of metal being added. The ethyl cellulose functions as a binder. The alpha terpineol and benzyl alcohol components, in the combination, are used to control viscosity, so that the overall paste will form a thixotropic element, which is particularly suitable for application to a non-planar surface. Due to the transfer pressures upon engagement of the deformable stamp with the circumference of the respective element on which the paste is to be applied, for example the ferrite element 32, or the core 34, thixotropic paste can be efficiently transferred.

The foregoing paste, which need not have the pulverized ceramic added, is preferably used if the conductive track is applied to unsintered, or merely baked, or pre-sintered substrates. The conductive track is then sintered together with the substrates at temperatures between about 1250° C. and 1400° C.

To print already sintered substrates, or core substrates which already have been lacquered, for example to apply value numbering or color coding, a paste of this composition is suitable:

15% isophthalic acid, having 40% styrene component 58.9% powdered silver, for example of the type D23, product No. 63 303 001 of the company Demetron 26.1% organic carrier, namely heavy oil H, which has 10.7% ethyl cellulose, 74.8% alpha terpineol and 14.5% benzyl alcohol.

All percentages by weight.

The paste can be baked at 200° C. and results in a conductive layer which has excellent adhesion on a ferrite core, without attacking lacquer thereon.

Various changes and modifications may be made within the scope of the inventive concept, and features described in connection with one of the embodiments may be used with the other. For example, different types of stubstrates may be used, ceramic substrates for example of Al$_2$O$_3$ being suitable as the carrier 30, which can also be used as a support for other electrical circuit components.

We claim:

1. Method of making an electrical inductance, comprising the steps of providing a carrier of insulating material (30);

applying a pattern of conductive tracks (31) forming partial windings, or portions of windings, on a surface of said carrier;

applying a core body (32) of ferrite material on the surface of said carrier, said core body having a core surface and a through-opening through the body extending to the carrier surface;

providing an elastically deformable printing stamp having a penetrating portion which is dimensioned to enter into the through-opening (32a) of the core body;

applying to a surface of said deformable printing stamp, including a surface of said penetrating portion, a pattern of an electrically conductive paste in the form of conductive tracks, positioned to connect with the conductive tracks (31) applied on the carrier surface (30), when the conductive paste is transferred to the core body (32);

pressing said printing stamp, with the paste applied thereto, against a surface of the core body including the region of the aperture, with sufficient pressure to deform the printing stamp to the extent that the penetrating portion thereof penetrates within the aperture, and said surface of the stamp engages the surface defining the aperture of the core body to transfer at least a portion of the conductive paste on the surface of the core body, including the surface of said aperture, the conductive tracks (31) being applied on the carrier and the transferred paste forming closed conductive loops extending on both sides of the ferrite core body.

2. Method according to claim 10 wherein the step applying the electrically conductive paste to the deformable stamp comprises applying said paste in a pattern which is predistorted so that the pattern of application will conform to a desired conductive pattern after deformation of the printing stamp upon penetration, at least in part, within the aperture of the substrate.

3. Method according to claim 1 wherein said carrier (30) has a flat surface; said ferrite core has a flat surface matching the flat surface of said carrier;

and further including the step of adhesively securing the ferrite core (32) to said carrier, after the step of applying the conductive tracks (31) on the carrier has been carried out.

4. Method of making a toroidal inductance, comprising the steps of providing a ring-shaped ferrite core (35) having a central aperture (38), and end surfaces (37);

providing an elastically deformable printing stamp having a penetrating portion which is dimensioned to enter into said aperture (38) of the ring-shaped core;

applying to a surface, including said penetrating portion of said deformable printing stamp, a pattern of an electrically conductive paste in form of conductive tracks;

pressing said printing stamp, with the paste applied thereto, against the core, and penetrating the opening within the toroidal core by the penetrating portion of the printing stamp, and applying the tracks of conductive paste to the interior of the aperture, while also applying tracks of the conductive paste to the end surfaces (37) of the toroidal core, and completing an electrical inductance circuit by applying a second pattern of electrical tracks to the outer surface (39) of the core;

said step of pressing the printing stamp against the toroidal core including the step of applying sufficient pressure to deform the printing stamp to the extent that the penetrating portion penetrates within the aperture and the stamp further engages the facing surfaces to transfer at least a portion of the conductive paste from the printing stamp to at least a portion of the surface of the aperture and a portion of the end surfaces of the toroidal core.

5. Method according to claim 4 wherein the step of pressing said printing stamp against a surface of the ring-shaped toroidal core and penetrating the opening comprises penetrating only a portion of the opening; and then repeating the step of pressing the printing stamp with the conductive paste applied thereto from a mirror image surface of the toroidal core thereagainst and penetrating the opening within the toroidal core from the other side by said stamp to apply the printing paste in the form of a continuous conductive track in the aperture of the toroidal core.

6. Method according to claim 5, wherein the toroidal core includes a cylindrical outer surface (39);

and said method includes the step of applying conductive tracks to the cylindrical outer surface, in electrically conductive communication with the conductive tracks applied to the end face of the toroidal core.

7. Method according to claim 4, wherein the toroidal core includes a cylindrical outer surface (39);

and said method includes the step of applying conductive tracks to the cylindrical outer surface, in electrically conductive communication with the conductive tracks applied to the end faces of the toroidal core.

\* \* \* \* \*

UNITED STATES PATENT AND TRADEMARK OFFICE
CERTIFICATE OF CORRECTION

PATENT NO. : 4,522,671

DATED : June 11, 1985

INVENTOR(S) : Werner GRUNWALD et al

It is certified that error appears in the above-identified patent and that said Letters Patent is hereby corrected as shown below:

Claim 2, line 1 (column 6, line 43) change "claim 10" to -- claim 1 --.

Signed and Sealed this

Fifteenth Day of October 1985

[SEAL]

Attest:

Attesting Officer

DONALD J. QUIGG

Commissioner of Patents and Trademarks—Designate